(12) United States Patent
Lee

(10) Patent No.: US 6,443,059 B1
(45) Date of Patent: Sep. 3, 2002

(54) SOLDER SCREEN PRINTING PROCESS

(75) Inventor: Hung Hsiang Lee, Hsinchu County (TW)

(73) Assignee: Apack Technologies Inc., Hsicnhu (TW)

( * ) Notice: Subject to any disclaimer, the term of this patent is extended or adjusted under 35 U.S.C. 154(b) by 15 days.

(21) Appl. No.: 09/801,229

(22) Filed: Mar. 7, 2001

(30) Foreign Application Priority Data

Feb. 7, 2001 (TW) ........................................ 90102584 A

(51) Int. Cl.[7] ................................................ B41M 1/12
(52) U.S. Cl. .................. 101/129; 101/126; 228/180.22; 427/96
(58) Field of Search ................................ 101/114, 123, 101/126, 129; 118/211, 213, 406; 228/175, 180.22; 427/96, 97, 282, 404, 409

(56) References Cited

U.S. PATENT DOCUMENTS

| | | | | |
|---|---|---|---|---|
| 5,493,969 A | * | 2/1996 | Takahashi et al. | .......... 101/126 |
| 5,740,730 A | * | 4/1998 | Thompson, Sr. | ............ 101/115 |
| 5,836,998 A | * | 11/1998 | Mueller et al. | ............. 101/126 |
| 5,996,488 A | * | 12/1999 | Yanagisawa et al. | ........ 101/129 |
| 6,247,640 B1 | * | 6/2001 | Kuwazaki et al. | ..... 228/180.22 |
| 6,258,227 B1 | * | 7/2001 | Flanigan | ...................... 118/504 |

* cited by examiner

Primary Examiner—Ren Yan
(74) Attorney, Agent, or Firm—J.C. Patents

(57) ABSTRACT

A solder screen printing process comprises: providing a wafer having a plurality of chips thereon, and a passivation layer covering the chips while exposing a plurality of bonding pads of the chips, wherein the bonding pads have a plurality of under bump metal (UBM) structures formed thereon; forming a pattern layer on the wafer, wherein the pattern layer has a plurality of first openings that defines the locations on the chips where bumps are to be subsequently formed; providing a carrier that has a wafer mounting location, providing a mounting support means that is mounted on the carrier, wherein the mounting support means has a second opening of the wafer size, such that the wafer mounting location of the carrier is exposed through the second opening; mounting the wafer on the carrier through the second opening of the mounting support means; and filling the first openings with a solder paste.

12 Claims, 3 Drawing Sheets

SOLDER SCREEN PRINTING PROCESS

CROSS-REFERENCE TO RELATED APPLICATION

This application claims the priority benefit of Taiwan application Ser. No. 90,102,584, filed Feb. 7, 2001.

BACKGROUND OF THE INVENTION

1. Field of the Invention

The invention relates to a bumping process. More particularly, the invention relates to a soldier screen printing process that is performed during bumping process.

2. Description of the Related Art

As the era of information technology progresses, the transmission or processing of information and documents through electronic products are commonly carried out in business processing. Accompanying the progress of technology, many commercial products with more convenient features are promoted, as mobile phones, computers, audio-video articles, while the emphasis is made to miniaturization.

In that present context, integrated circuit packaging technology, accompanying the integrated circuit manufacturing technology, tends to high density of manufactured products. Consequently, many high pin count packaging structures and high density of chip scale packaging (CSP) structures are developed. Flip chip technology, because its guiding principle is mounting and connecting directly the chip to the carrier through a plurality of bumps, which thus can shorten the conductive path while the area of the package is also reduced, is thus substantially employed in chip scale packaging (CSP). In order to improve the throughput and convenience of packaging processes, wafer level packaging is also a presently trend of development using flip chip technology.

Flip chip technology principally consists of forming conductive bumps on the chip I/O bonding pads, the chip is then flipped to be connected to a carrier through the conductive bumps. Such a type of connection structure should be distinguished from that of wire bonding, an advantage over wire bonding being various arrangements of I/O bonding pads, such as matrix arrangement or interlace arrangement, and providing the shortest distance between the chip and the substrate. Other advantages among which reduced surface area, high count of I/O bonding pads, a short signal transmission path and easy control of noise, are characteristic of flip chip packages.

In flip chip technology, the conductive bumps are conventionally formed above the bonding pads through solder screen printing or plating processes.

Referring now to FIG. 1 and FIG. 2, there are shown schematic views illustrating a conventional solder screen printing process in wafer bumping. FIG. 1 is a schematic top view showing a wafer with a plurality of chips formed thereon, and FIG. 2 is a schematically cross-sectional view illustrating the wafer of FIG. 1 at an intermediary starting stage before solder screen printing process. First, a wafer 100 is provided, with a plurality of chips 102 formed thereon. Each of the chips 102 has a plurality of bonding pads 104 formed thereon, while a passivation layer 106 covers the chips 102 except for the bonding pad 104 locations that are exposed by the passivation layer 106. An under bump metal (UBM) structure 108 is formed respectively on each of the bonding pads 104. Then, a stencil 110 with a plurality of openings 112 formed therein is arranged on the chips 102 in such a manner that the openings 112 are respectively aligned with the bonding pad 104 locations, thereby exposing the locations where solder bumps are to be subsequently formed. Then, by dint of a scraper 114, a solder paste 116 is filled in the openings 112 according to a screen printing method.

A drawback of the conventional solder screen printing process as described above is a nonuniform thickness of the solder paste that is formed in the openings 112. As a result, the solder bumps that are subsequently formed will also have nonuniform height, which would cause a non-reliable connection of the chip through the solder bumps.

A solution is thus needed to improve the conventional solder screen printing process and overcome at least the issues and drawbacks described above.

SUMMARY OF THE INVENTION

One major aspect of the present invention is to provide a solder screen printing process, wherein a pattern layer is formed on the wafer to define bump locations thereon while the wafer is mounted in a mounting support means. The mounting support means is such that, with the wafer mounted therein, the height of the surface of the pattern layer onto which the solder screen printing process is applied is substantially reduced, such that the solder paste is thereby filled with an uniform thickness.

To attain the foregoing and other objects, the present invention provides a solder screen printing process comprising: providing a wafer that has a plurality of chips formed thereon and a passivation layer that covers the chips, wherein each of the chips has a plurality of bonding pads that each has an under bump metal (UBM) structure formed thereon, wherein the under bump metal (UBM) structure is exposed through the passivation layer; forming a pattern layer on the wafer, wherein the pattern layer has a plurality of first through openings formed therein to define a plurality of locations where a plurality of bumps is to be formed; providing a carrier that has a wafer mounting location thereon; providing a mounting support means that is arranged on the carrier, such that a second opening of the mounting support means of the wafer size exposes the wafer mounting location of the carrier; mounting the wafer in the second opening of the mounting support means; and performing a solder screen printing by filling a solder paste in the first openings of the pattern layer.

By achieving the above solder screen printing process, wherein the mounting support means enables the wafer to be maintained while the height of the surface of the pattern layer is reduced, the solder paste can be filled with an uniform thickness through the screen printing process.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The following detailed description of the embodiments and examples of the present invention with reference to the accompanying drawings is only illustrative and not limiting.

Figure 1:
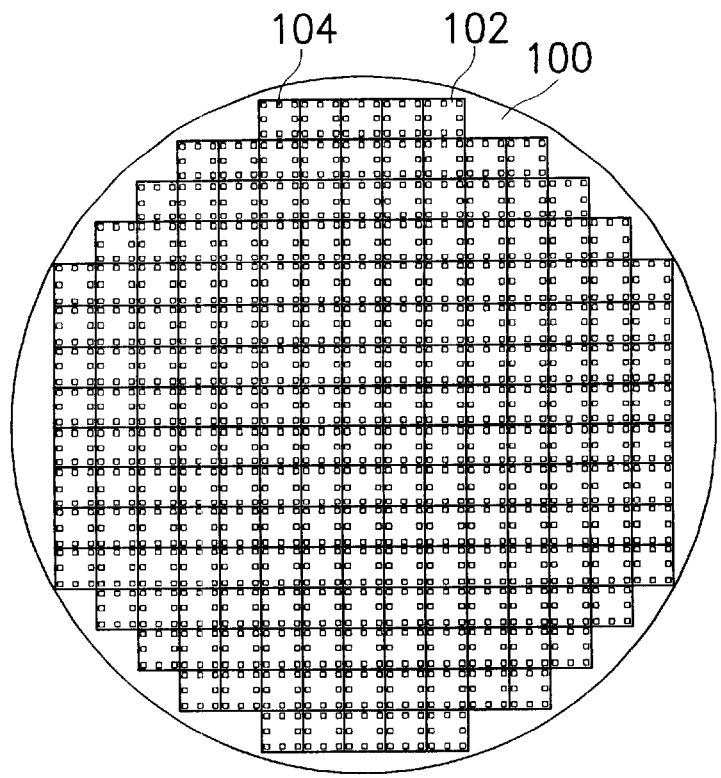
FIG. 1 and FIG. 2 are schematic views illustrating a conventional solder screen printing process.
Figure 2:
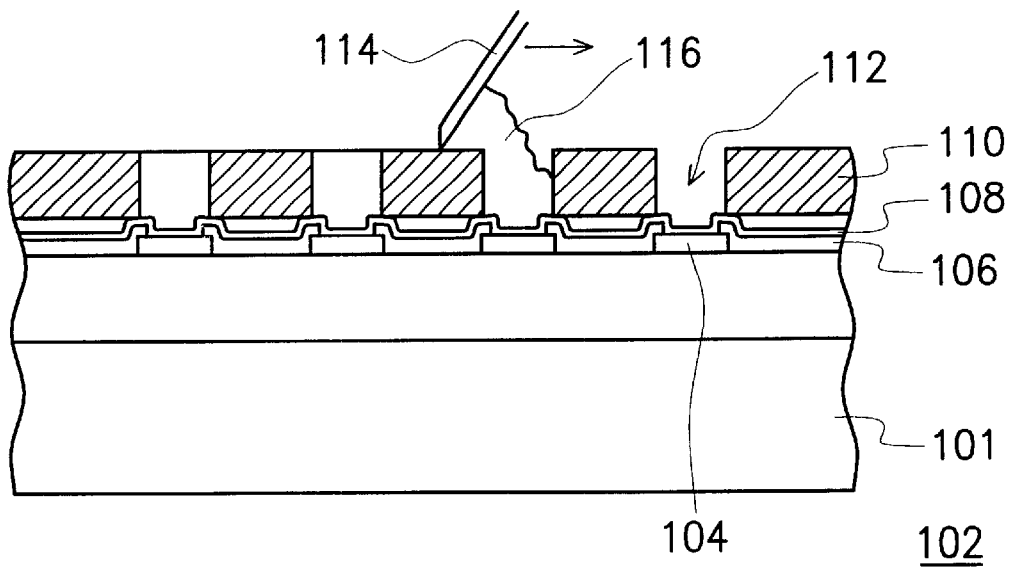
Figure 3:
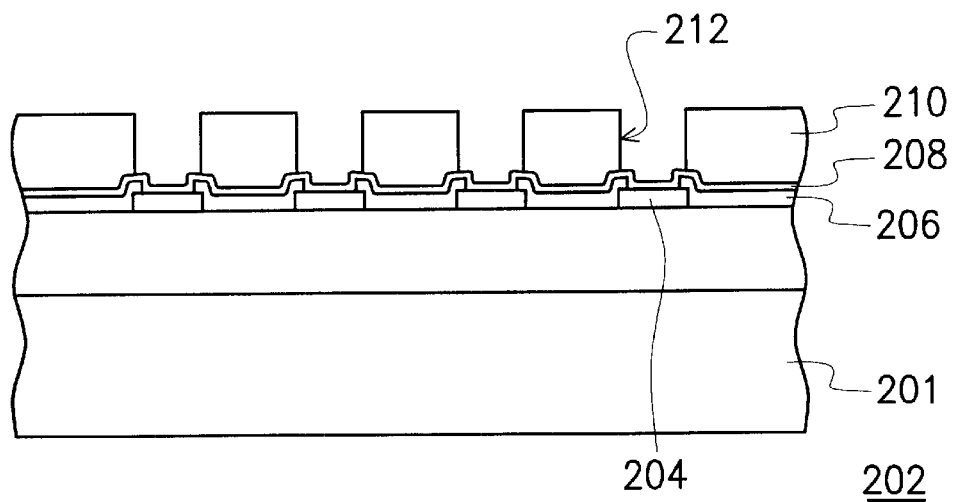
FIG. 3 through FIG. 5 are schematic views illustrating the solder screen printing process according to an embodiment of the present invention.

Referring to FIG. 3, a schematic view illustrates an intermediary starting stage in a solder screen printing process according to an embodiment of the present invention. First, a wafer 200 is provided, the wafer 200 having formed thereon a plurality of chips 202. Each of the chips 202 has formed thereon a plurality of bonding pads 204. The bonding pads 202 are made of, for instance, aluminum or other good conductor material. A passivation layer 206 is formed on the wafer 200 to expose only the bonding pads 204 of the chips 202. The passivation layer 206 is, for instance, a silicon oxide layer, silicon nitride layer, or polyimide layer. A plurality of under bump metal (UBM) structures 208 is respectively formed on the bonding pads 204 of the chips 202. The under bump metal (UBM) structures 208 are made of, for instance, chromium-copper alloy, or multi-layers of copper.

Then, a pattern layer 210 is formed on the chips 202 in such a manner that a plurality of first openings 212 formed in the pattern layer 210 is aligned with the bonding pad 204 locations to define the locations where a plurality of bumps is to be subsequently formed. The pattern layer 210 can be, for instance, a dry film or other wet organic photoresist.

Figure 4:
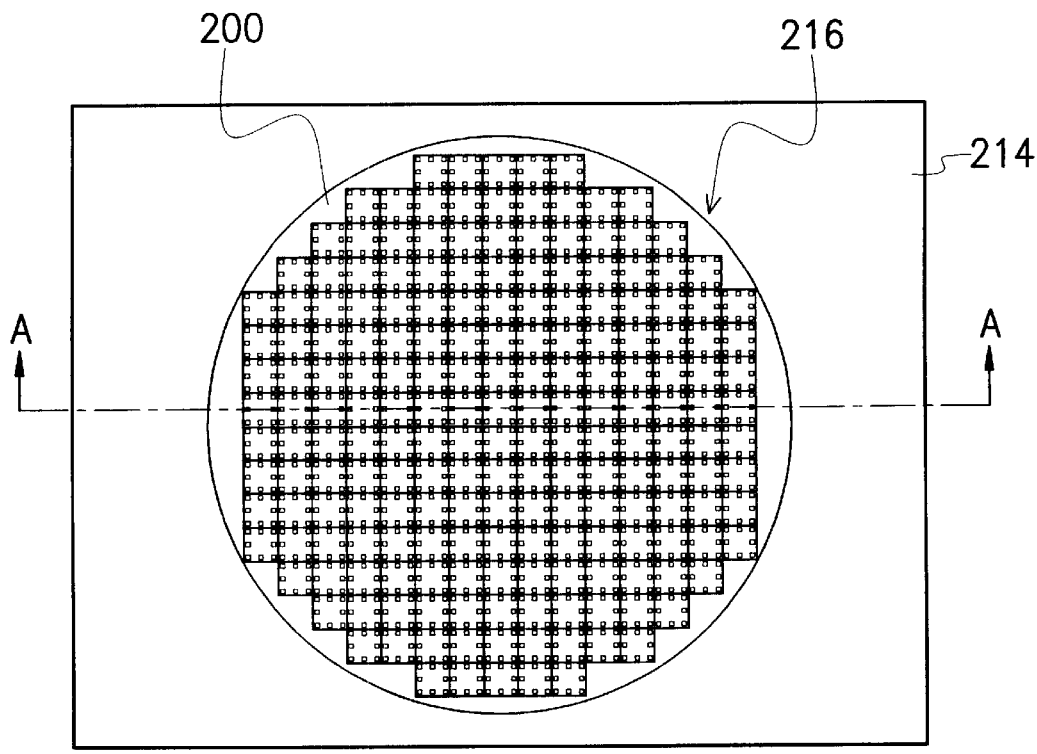
Figure 5:
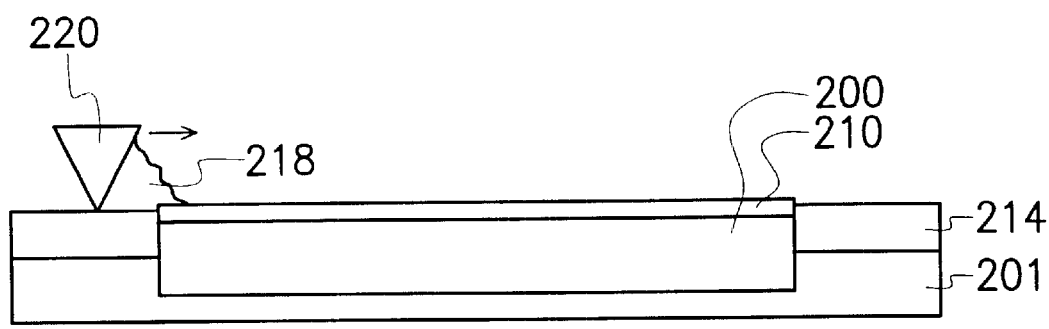

Referring to FIG. 4 and FIG. 5, FIG. 4 being a schematic top view of the structure shown in cross-sectional view in FIG. 5, there is schematically shown the mounting of the wafer in a mounting support means for solder screen printing, according to an embodiment of the present invention. A mounting support means 214 is provided on a carrier 201. The mounting support means 214 is approximately between 150 $\mu$m and 250 $\mu$m thick, and has a second opening 216 formed therein having the size of the wafer 200. The second opening 216 passes through the mounting support means 214 that is arranged on the carrier 201 such that the second opening 216 corresponds to the location where the wafer 200 is to be mounted on the carrier 201. Then, the wafer 200 is mounted on the carrier 201 through the second opening 216 of the mounting support means 214. Conventionally without the mounting support means of the present invention, the wafer is arranged on the carrier such that a thickness of approximately 300 $\mu$m to 350 $\mu$m of the wafer protrudes over the carrier. In the present invention, with the mounting support means 214 having a thickness between approximately 150 $\mu$m and 250 $\mu$m, the wafer 200 can be arranged such that only a thickness of the wafer of approximately between 100 $\mu$m and 150 $\mu$m protrudes from the surface of the mounting support means 214.

Referring to FIG. 5, with the wafer 200 arranged in the second opening 216 of the mounting support means 214 on the carrier 201, a solder screen printing process is then performed using a scraper 220 to filled the first openings 212 with a solder paste 218. The solder paste 218 can be typically, for instance, tin-lead paste $Sn_{63}Pb_{37}$, tin-silver paste $Sn_{96.5}Ag_{3.5}$, tin-antimony paste $Sn_{95}Sb_5$, or other solder paste conventionally known in the art.

The foregoing description of embodiments and examples of the present invention reveals at least the following features and advantages. Conventionally without the mounting support means such as described above, the wafer is arranged and maintained on the carrier through vacuum means, such that the wafer protrudes from the carrier surface approximately 300 $\mu$m to 350 $\mu$m high. In the present invention, with the use of the mounting support means 214 as a support means, the protrusion of the wafer 200 with the pattern layer 210 as top layer can be substantially reduced without modifying the carrier 201. Thereby, the solder paste 218 can be filled with uniform thickness. In addition, the solder paste 218 can be also favorably prevented from dropping onto the carrier while solder screen printing is performed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A solder screen printing process comprising:

providing a wafer that has a plurality of chips formed thereon and a passivation layer that covers the chips, wherein each of the chips has a plurality of bonding pads that has respectively an under bump metal (UBM) structure formed thereon, wherein the under bump metal (UBM) structure is exposed through the passivation layer;

forming a pattern layer on the wafer, wherein the pattern layer has a plurality of first through openings formed therein to define a plurality of locations where a plurality of bumps is to be formed;

providing a carrier that has a wafer mounting location thereon;

providing a mounting support means that is arranged on the carrier, wherein the mounting support means has a second opening of the wafer size that exposes the wafer mounting location of the carrier;

mounting the wafer in the second opening of the mounting support means; and performing a solder screen printing by filling a solder paste in the first openings of the pattern layer.

2. The solder screen printing process of claim 1, wherein the pattern layer comprises a dry film.

3. The solder screen printing process of claim 1, wherein the pattern layer comprises an organic liquid photoresist.

4. The solder screen printing process of claim 1, wherein the solder paste comprises tin-lead $Sn_{63}Pb_{37}$ paste, tin-silver $Sn_{96.5}Ag_{3.5}$ paste, tin-antimony $Sn_{95}Sb_5$ paste or one of the foregoing solder pastes with other ratio.

5. The solder screen printing process of claim 1, wherein the first surface of the mounting support means is lower than the surface of the pattern layer.

6. The solder screen printing process of claim 5, wherein the wafer protrudes over the mounting support means between approximately 100 $\mu$m and 150 $\mu$m high.

7. A solder screen printing process comprising:

providing a wafer that has a plurality of chips formed thereon and a passivation layer that covers the chips, wherein each of the chips has a plurality of bonding pads that each has an under bump metal (UBM) structure formed thereon, wherein the under bump metal (UBM) structure is exposed through the passivation layer;

forming a pattern layer on the wafer, wherein the pattern layer has a plurality of first through openings formed therein to define a plurality of locations where a plurality of bumps is to be formed;

providing a carrier that has a wafer mounting location thereon;

providing a mounting support means that is arranged on the carrier, wherein the mounting support means has a second opening of the wafer size that exposes the wafer carrier location of the carrier;

mounting the wafer in the second opening of the mounting support means;

performing a solder screen printing to fill a solder paste in the first openings of the pattern layer;

performing a reflow process; and removing the pattern layer.

8. The solder screen printing process of claim 7, wherein the pattern layer comprises a dry film.

9. The solder screen printing process of claim 7, wherein the pattern layer comprises an organic liquid photoresist.

10. The solder screen printing process of claim 7, wherein the solder paste comprises tin-lead $Sn_{63}Pb_{37}$ paste, tin-silver $Sn_{96.5}Ag_{3.5}$ paste, tin-antimony $Sn_{95}Sb_5$ paste, or one of the foregoing solder pastes with other ratio.

11. The solder screen printing process of claim 7, wherein the first surface of the mounting support means is lower than the surface of the pattern layer.

12. The solder screen printing process of claim 11, wherein the wafer protrudes over the mounting support means between approximately 100 $\mu$m and 150 $\mu$m high.

* * * * *